(12) United States Patent
Verbaas et al.

(10) Patent No.: US 11,774,298 B2
(45) Date of Patent: Oct. 3, 2023

(54) MULTI-POINT THERMOCOUPLES AND ASSEMBLIES FOR CERAMIC HEATING STRUCTURES

(71) Applicant: Tokyo Electron Limited, Tokyo (JP)

(72) Inventors: Melvin Verbaas, Yamanashi (JP); Kentaro Asakura, Yamanashi (JP); Takashi Mochizuki, Yamanashi (JP); Takahisa Mase, Yamanashi (JP); Nobutaka Yoshioka, Yamanashi (JP); Saki Matsuo, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 731 days.

(21) Appl. No.: 16/789,046

(22) Filed: Feb. 12, 2020

(65) Prior Publication Data
US 2021/0247240 A1  Aug. 12, 2021

(51) Int. Cl.
*G01K 7/02* (2021.01)
*H05B 3/26* (2006.01)
(Continued)

(52) U.S. Cl.
CPC ............ *G01K 7/02* (2013.01); *G01K 1/08* (2013.01); *G01K 1/14* (2013.01); *G01K 1/16* (2013.01);
(Continued)

(58) Field of Classification Search
CPC .. G01K 7/02; G01K 1/08; G01K 1/14; G01K 1/16; H01L 21/67098; H01L 21/67103; H01L 21/68785; H05B 3/141; H05B 3/265
See application file for complete search history.

(56) References Cited

U.S. PATENT DOCUMENTS 3,321,974 A * 5/1967 Sterbutzel ............... G01K 1/20
  374/134
5,689,087 A * 11/1997 Jack ........................ G01K 7/02
  136/238
7,832,616 B2 * 11/2010 Lin ......................... H05B 3/143
  228/248.1
(Continued)

FOREIGN PATENT DOCUMENTS

JP  2012080103 A  4/2012
JP  2012088171 A  5/2012
(Continued)

OTHER PUBLICATIONS

English machine translation of JP-012088171 to Kawashima—2012 (Year: 2012).*
(Continued)

*Primary Examiner* — Nathaniel T Woodward
*Assistant Examiner* — Philip L Cotey
(74) *Attorney, Agent, or Firm* — WEIHROUCH IP

(57) ABSTRACT

Multi-point thermocouples and assemblies are disclosed for ceramic heating structures. The disclosed embodiments provide multi-point connections in distinct areas to provide good temperature-sensing contacts between metal thermocouples and ceramic bodies while also providing improved flexibility. As such, cracking of ceramic bodies for heating structures is avoided. For one embodiment, assemblies including a multi-point thermocouple and a ceramic body are used in bake plates for processing systems that process microelectronic workpieces. The metal thermocouple has a flat surface used for connections to the ceramic body. Preferably, the thermocouple is relatively thin and provides improved connection sites and flexibility.

23 Claims, 5 Drawing Sheets

(51) Int. Cl.
    *H05B 3/14*         (2006.01)
    *G01K 1/08*         (2021.01)
    *H01L 21/67*       (2006.01)
    *G01K 1/14*         (2021.01)
    *G01K 1/16*         (2006.01)
    *H01L 21/687*      (2006.01)

(52) U.S. Cl.
    CPC ....... *H01L 21/67098* (2013.01); *H05B 3/141* (2013.01); *H05B 3/265* (2013.01); *H01L 21/67103* (2013.01); *H01L 21/68785* (2013.01)

(56) References Cited

U.S. PATENT DOCUMENTS

| | | | | |
|---|---|---|---|---|
| 8,821,014 | B2 * | 9/2014 | Saito | G01K 1/14 |
| | | | | 374/179 |
| 2007/0251938 | A1 * | 11/2007 | Lin | H05B 3/265 |
| | | | | 219/443.1 |
| 2008/0043806 | A1 * | 2/2008 | Murakami | G01J 5/0003 |
| | | | | 374/134 |
| 2008/0080591 | A1 * | 4/2008 | Tanaka | G01K 7/02 |
| | | | | 374/E7.004 |
| 2008/0110963 | A1 * | 5/2008 | Lin | H05B 3/143 |
| | | | | 228/124.1 |
| 2012/0211933 | A1 * | 8/2012 | Goto | H01L 21/68757 |
| | | | | 269/293 |
| 2012/0244645 | A1 * | 9/2012 | Rathsack | H01L 21/67253 |
| | | | | 438/10 |
| 2014/0204975 | A1 * | 7/2014 | Kosakai | G01K 13/00 |
| | | | | 374/100 |
| 2016/0047700 | A1 * | 2/2016 | Danley | G01K 3/08 |
| | | | | 374/31 |
| 2017/0045466 | A1 * | 2/2017 | Noritake | G01K 7/02 |
| 2021/0243848 | A1 * | 8/2021 | Takahashi | H01L 21/02 |
| 2021/0247240 | A1 * | 8/2021 | Verbaas | H05B 3/265 |

FOREIGN PATENT DOCUMENTS

JP       2018136263 A     8/2018
KR     20100131236       12/2010

OTHER PUBLICATIONS

International Search Report and Written Opinion for PCT/US2021/017450 dated Jun. 3, 2021 (9 pp).

* cited by examiner

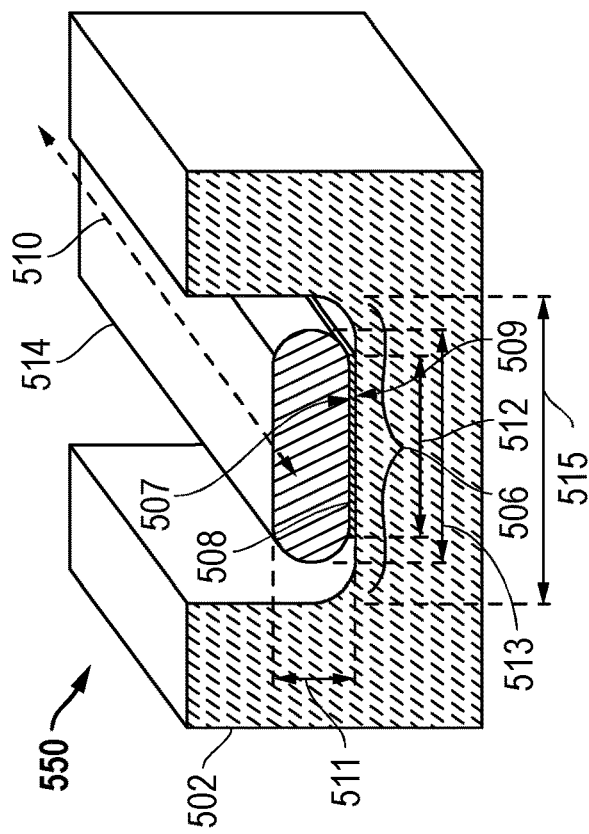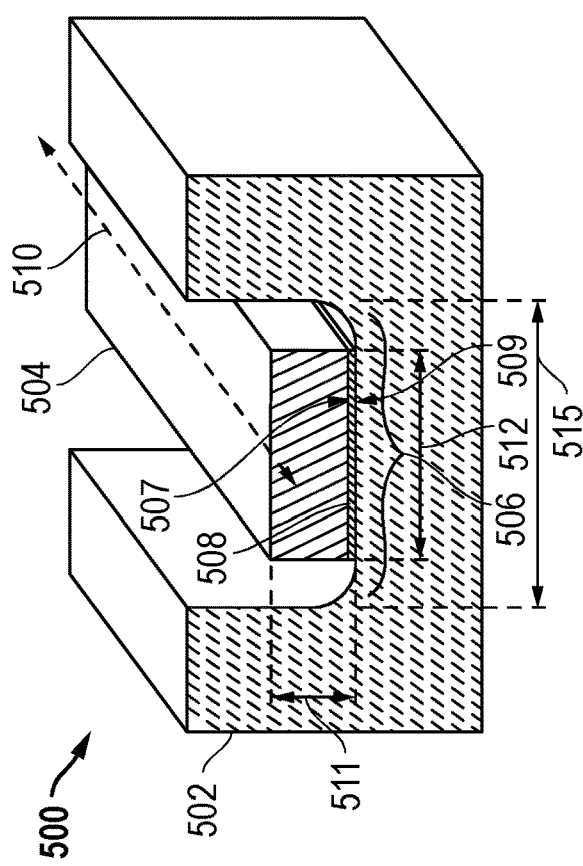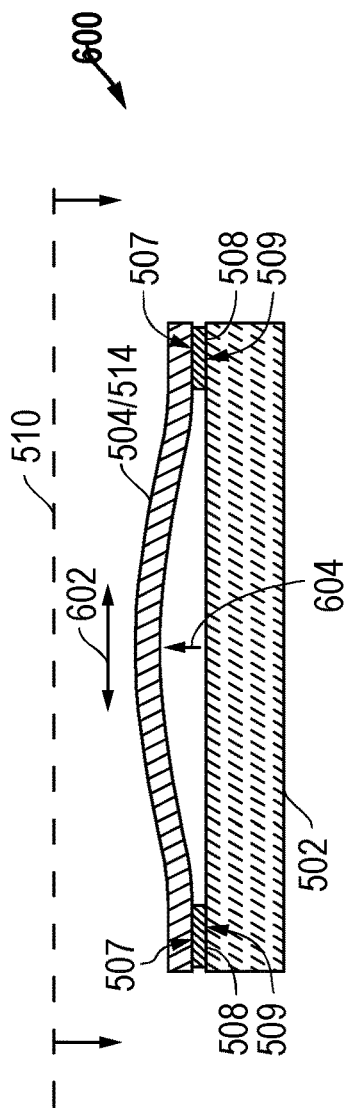

MULTI-POINT THERMOCOUPLES AND ASSEMBLIES FOR CERAMIC HEATING STRUCTURES

BACKGROUND

The present disclosure relates to methods for the manufacture of microelectronic workpieces including the formation of patterned structures on microelectronic workpieces.

One or more bake processes can be used during the manufacture of microelectronic workpieces (e.g., semiconductor wafers). For example, a photolithography process flow may include various semiconductor bake processes including, e.g., a post application bake (PAB), a post exposure bake (PEB) and/or a post development bake (PDB). These bake processes can be used to thermally treat (i.e., heat or bake) one or more liquid solutions, layers, or films applied to or deposited onto a substrate. During these bake processes, solvent-rich, polymer-containing, layers or films are baked at temperatures close to and potentially well above the boiling point of the casting solvent used. The bake process time and temperature are used to drive out solvents and cure or harden the film, thereby defining the characteristics of the film at exposure and post exposure develop where the circuit feature is defined, prior to etching the feature into the substrate.

FIG. 1 (Prior Art) provides an example embodiment of a bake module 10 that can be used to perform a bake process, such as a PAB, PEB, or PDB process. The bake module 10 shown in FIG. 1 (Prior Art) could be a stand-alone bake module or may be incorporated within a substrate processing system that includes various modules for processing semiconductor substrates. As shown in FIG. 1 (Prior Art), bake module 10 may generally include a processing chamber 12 bounded by one or more exterior walls 14, a bake plate (or heater) 16 disposed within the processing chamber 12, and a bake chamber lid 18 forming a portion of the processing chamber 12. The bake module 10 shown in FIG. 1 (Prior Art) also includes at least one horizontal shielding plate 20, one or more interior walls 22 and a supporting plate 24. The horizontal shielding plate 20 and the interior walls 22 are coupled to the exterior wall(s) 14 of the bake module 10, while the supporting plate 24 is coupled between the interior walls 22 to form a mounting region for the bake plate 16. Although not shown in FIG. 1 (Prior Art), bake plate 16 and supporting plate 24 may each include a plurality of through-holes through which lift pins can be inserted and used to lift a substrate (e.g., a semiconductor wafer, W) off, or lower the substrate onto, the upper surface of the bake plate.

When bake module 10 is configured in a wafer transfer mode, the lift pins (not shown) can be pushed up to allow a substrate (or wafer, W) to be transferred into/out of the bake module. As shown in FIG. 1 (Prior Art), a processing arm 26 may be used to transfer a substrate into/out of bake module 10 via an opening 28 formed in at least one of the exterior walls 14. The processing arm 26 may position the substrate onto lift pins, which are then lowered to arrange the substrate on or above the upper surface of the bake plate 16. When retrieving a substrate from bake module 10, the lift pins may be raised so that the processing arm 26 can retrieve the substrate from the bake plate 16 and unload the substrate through opening 28.

When bake module 10 is configured in an operating mode, the lift pins (not shown) can be pulled down to arrange the substrate on the bake plate 16 and begin thermal treatment in the processing chamber 12. During a bake process (such as, e.g., a PAB, PEB, or PDB process), the temperature of bake plate 16 is raised to thermally treat (i.e., heat or bake) the wafer. For example, the temperature of the bake plate 16 may be increased (e.g., to a temperature between about 80° C. and about 250° C.) to thermally treat one or more layers or films that were previously applied or deposited onto the substrate. Typical layers or films include, but are not limited to, topcoat barrier layers, topcoat antireflective layers (TARC), bottom antireflective layers (BARC), imaging layers (PR or photoresist) and sacrificial and barrier layers (hard mask) for etch stopping. During the bake process, gas generated from the surface of the substrate before, during, and/or after the bake process may be exhausted through an exhaust port 30 formed in the bake chamber lid 18, and vented from the processing chamber 12 via exhaust line 32 and exhaust unit 34.

In some cases, the bake plate 16 included within bake module 10 may be formed from a ceramic material having a high thermal conductivity and low coefficient of thermal expansion, such as silicon nitride ($Si_3N_4$), SiAlON (ceramic materials including silicon (Si), aluminum (Al), oxygen (O), and nitrogen (N)), aluminum nitride (AlN), aluminum oxide (Al2O3), boron nitride (BN), or a ceramic material having low electrical conductivity. Aluminum nitride is commonly used to form bake plates used to thermally treat semiconductor substrates, due to its high thermal conductivity (e.g., >130 W/mK), low coefficient of thermal expansion (e.g., 3-6 $10^{-6}/°$ C.), high maximum temperature (e.g., up to about 1700° C.) and excellent corrosion resistance.

As shown in FIG. 1 (Prior Art), bake module 10 may also include one or more resistive heating elements 36, one or more temperature sensors 38 and a controller 40. The one or more resistive heating elements 36 may be embedded within the bake plate 16 to generate heat, which is used to thermally treat the substrate (or wafer W) mounted on or above an upper surface of the bake plate. The one or more temperature sensors 38 may be embedded within the bake plate 16 to measure the temperature of the bake plate. Controller 40 is coupled to the resistive heating element(s) 36 and the temperature sensor(s) 38 and configured to control the temperature of the bake plate 16 based on the temperature measurement received from the temperature sensor(s). For example, a power source associated with controller 40 may be coupled to supply current to resistive heating element(s) 36. Upon receiving a temperature measurement from temperature sensor(s) 38, controller 40 may maintain or adjust the amount of current supplied to the resistive heating element(s) 36 to maintain or adjust the amount of heat generated thereby.

In some cases, a single resistive heating element 36 formed from a coiled metal wire may be embedded within the bake plate 16, as shown in FIG. 2 (Prior Art). In some cases, the resistive heating element 36 shown in FIG. 2 (Prior Art) may be formed from a metal material having a high melting point and a thermal coefficient of expansion that is greater than or equal to that of the ceramic material used to form the bake plate 16. A metal material with a relatively high melting point is typically required, due to the high sintering temperature (e.g., about 1700° C. for AlN) of the ceramic material used to form the bake plate 16. Selecting a metal material with a thermal coefficient of expansion that is greater than or equal to that of the ceramic material used to form the bake plate 16 helps to prevent microcracks from forming in the bake plate over time with repeated heating/cooling cycles. When bake plate 16 is formed from aluminum nitride (AlN), tungsten, molybdenum and alloys thereof are commonly used to form resistive heating element 36. A nickel alloy and other metal alloys having stability at high temperatures can also be used to implement the resistive heating element 36.

In FIG. 2 (Prior Art), a single temperature sensor 38 is positioned near and/or in direct contact with the resistive heating element 36 to measure the temperature of the resistive heating element. In many cases, temperature sensor 38 may be implemented as a straight metal, type K thermocouple (TC) tube. The thermocouple is typically inserted within a hole formed within the bake plate 16, which is often centered within the bake plate.

Unfortunately, the temperature sensor 38 included within the bake plate 16 shown in FIG. 2 (Prior Art) is undesirable for many reasons. First, a straight metal, type K thermocouple (TC) tube cannot be sintered into a bake plate formed from aluminum nitride (AlN), since the maximum continuous temperature of a type K thermocouple (e.g., about 1100° C.) is much less than the sintering temperature of AlN (e.g., about 1700° C.). Second, since a straight metal TC tube has limited flexibility, it cannot be used to directly measure the temperature in the outer zones of the bake plate 16. Although the outer zone temperature may be approximated (e.g., by applying an offset to the temperature measured by temperature sensor 38), the approximated temperature usually fails to properly control temperatures in the outer zone, often resulting in breakage of the bake plate 16. In addition, because the temperature sensor 38 shown in FIG. 2 (Prior Art) is positioned near and/or in direct contact with the resistive heating element 36, it cannot be used to accurately measure the temperature near the upper surface of the bake plate 16 or closely approximate the temperature of the substrate (or wafer, W) mounted thereon.

In other cases, a plurality of resistive heating elements 36 may be embedded within the bake plate 16 to create a bake plate with multiple heating zones. In the example shown in FIG. 3 (Prior Art), for example, an inner heating element 36a and an outer heating element 36b are embedded within bake plate 16 to create a bake plate with dual heating zones. When bake plate 16 is formed from aluminum nitride (AlN), the inner and outer heating elements 36a/b may be formed from tungsten, molybdenum or an alloy thereof as well as from a nickel alloy or another a metal alloy having stability at high temperatures to enable the heating elements to withstand high AlN sintering temperatures and to prevent microcracks from forming in the bake plate over time. In the example shown in FIG. 3 (Prior Art), the inner and outer heating elements 36a/b are positioned relatively far away from the upper surface of the bake plate 16 to prevent the heating elements from imprinting on the substrate.

In FIG. 3 (Prior Art), a single temperature sensor 38 is positioned near an upper surface of the bake plate 16 to monitor a temperature near the upper surface of the bake plate, and to more closely approximate the temperature of the substrate (or wafer, W) mounted thereon. As with the previous example shown in FIG. 2 (Prior Art), the temperature sensor 38 shown in FIG. 3 (Prior Art) may be implemented as a straight metal, type K thermocouple (TC) tube, which is inserted within a hole formed and centered within the bake plate 16. As such, the temperature sensor 38 shown in FIG. 3 (Prior Art) suffers from many of the same disadvantages as the temperature sensor 38 shown in FIG. 2 (Prior Art). For example, the straight metal, type K TC tube shown in FIG. 3 (Prior Art) cannot be sintered into an AlN bake plate and cannot be used to accurately measure temperatures in the outer zones of the bake plate.

Although sensing in outer zones could be achieved using additional temperature sensors, multiple individual temperature sensors consume too much area inside the shaft of stage heater. Further, the round TC tube used in prior solutions for the temperature sensor 38 is a metal material, and the TC tube will cause expansion issues if positioned inside the ceramic heater plate 16. In particular, the thermal expansion coefficient difference between the metal TC (e.g., stainless steel) and the ceramic material (e.g., AlN) will cause the ceramic material to crack or break.

FIG. 4A (Prior Art) provides a perspective view 400 of an example embodiment where a round, metal TC tube is used as a temperature sensor 38 placed or inserted into a trench 404 formed within a bake plate 16. The round shape gives high-strength properties and rigidity along the longitudinal axis 402. Typically, the bake plate 16 will be a ceramic material, such as AlN, and the round TC tube will be a stainless steel (SST) material. As such, for a good contact, the round TC tube needs to be placed in a very well-defined trench 404 with tightly controlled dimensions. AlN and SST, however, have significant differences in their thermal expansion coefficients. In particular, the metal TC tube (e.g., SST) will expand faster than the ceramic bake plate 16 (e.g., AlN), and the metal TC tube will tend to crack and break the ceramic body. This will not only occur in axial direction along the axis 402, but also along the radial direction 454.

FIG. 4B (Prior Art) provides a cross-section view 450 of the example embodiment in FIG. 4A (Prior Art) where a round, metal TC tube is used as a temperature sensor 38 placed in a trench 404 formed within a bake plate 16. As indicated above, the metal TC tube will expand faster than the ceramic bake plate 16 in the radial direction 454, and this difference in expansion will tend to crack and break the ceramic body. In prior solutions, therefore, the trench 404 is typically enlarged to provide space between the edges of the trench 404 and the surface of the metal TC tube that is used as the temperature sensor 38. In prior solutions, a metal TC tube has been positioned loosely or freely within a trench 404 or hole within a ceramic body or bake plate 16, has been bolted to a surface of the ceramic body or bake plate 16 without using a trench 404, or has been inserted and spring-loaded within a hole within the ceramic body or bake plate 16 to urge the end of the metal TC tube against a surface of the ceramic body or bake plate 16. These solutions, however, still suffer degraded sensing due to thermal expansion variations of the ceramic and TC materials.

It is further noted that some prior solutions have used multi-point TCs to measure liquid temperatures in various locations inside a ceramic vessel or tube carrying a liquid media. For such solutions, the liquid media being sensed flows adjacent to and physically touches sensing points along the multi-point TCs, and the multi-point TCs are loosely inserted and free-floating within the ceramic vessel or tube carrying the liquid media. These prior multi-point TC solutions, however, would provide poor thermal contact in non-liquid temperature sensing in a ceramic body. As such, temperature measurements would be inaccurate, and response time to temperature change of a ceramic body would be very slow.

SUMMARY

Multi-point thermocouples and assemblies are disclosed for ceramic heating structures. The disclosed embodiments provide relatively thin thermocouple shapes and multi-point connections in distinct areas to provide good temperature-sensing contacts while also providing improved flexibility. As such, cracking of ceramic bodies for heating structures is avoided. Different or additional features, variations, and embodiments can also be implemented, and related systems and methods can be utilized as well.

For one embodiment, an assembly is disclosed including a ceramic body and a thermocouple. The ceramic body includes a channel. The metal thermocouple includes metal and has a flat surface. In addition, the flat surface of the thermocouple has connections to the ceramic body at multiple points along the channel for the ceramic body.

In additional embodiments, a width of the flat surface is between twenty (20) percent and ninety-five (95) percent of a width of the channel. In further additional embodiments, a width of the flat surface is at least one-and-a-half times or greater than a height of the thermocouple, or an overall width of the channel is two (2) percent to twenty (20) percent larger than an overall width of the thermocouple.

In additional embodiments, the flat surface includes a continuous flat surface or a flat surface separated by one or more gaps. In further additional embodiments, the connections between the thermocouple and the ceramic body include brazed connections. In further additional embodiments, the thermocouple is a rectangular-shaped thermocouple or an oval-shaped thermocouple. In still further additional embodiments, the thermocouple includes stainless steel, and the ceramic body includes aluminum nitride.

In additional embodiments, the channel for the ceramic body has a flat surface with a width greater than or equal to a width of the flat surface for the thermocouple, and an overall width of the channel for the ceramic body is between two percent and twenty percent of an overall width of the thermocouple. In further additional embodiments, the ceramic body further includes one or more heating elements.

In additional embodiments, the assembly is a bake plate used in a post exposure bake module.

For one embodiment, a processing system is disclosed including a processing chamber and a bake plate positioned within the processing chamber. The bake plate includes a ceramic body having a channel and a thermocouple including metal and having a flat surface. Further, the flat surface of the thermocouple has connections to the ceramic body at multiple points along the channel for the ceramic body.

In additional embodiments, the connections between the thermocouple and the ceramic body include brazed connections. In further additional embodiments, the thermocouple is a rectangular-shaped thermocouple or an oval-shaped thermocouple.

In additional embodiments, the ceramic body further includes multiple heating elements to provide multi-zone heating. In further embodiments, the connections of the thermocouple to the ceramic body allow for multi-point temperature measurements. In still further embodiments, the bake plate has a single entry point for the thermocouple.

In additional embodiments, the bake plate is used in a post exposure bake (PEB) process.

For one embodiment, a method to form an assembly is disclosed including providing a ceramic body including a channel, providing a thermocouple including metal and having a flat surface, and connecting the flat surface of the thermocouple to the ceramic body at multiple points along the channel for the ceramic body.

In additional embodiments, the flat surface includes a continuous flat surface or a flat surface separated by one or more gaps. In further additional embodiments, the connecting at multiple points includes brazed connections. In still further additional embodiments, the thermocouple is a rectangular-shaped thermocouple or an oval-shaped thermocouple.

In additional embodiments, the assembly is part of a post exposure bake module.

Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 5A provides a perspective view where a rectangular shape is used as a relatively thin shape for a thermocouple positioned within a channel in a ceramic body.

FIG. 5B provides a perspective view where an oval shape is used as a relatively thin shape for a thermocouple positioned within a channel in a ceramic body.

FIG. 6 provides a cross-section view of the example embodiments in FIGS. 5A and 5B.

DETAILED DESCRIPTION

Figure 1:
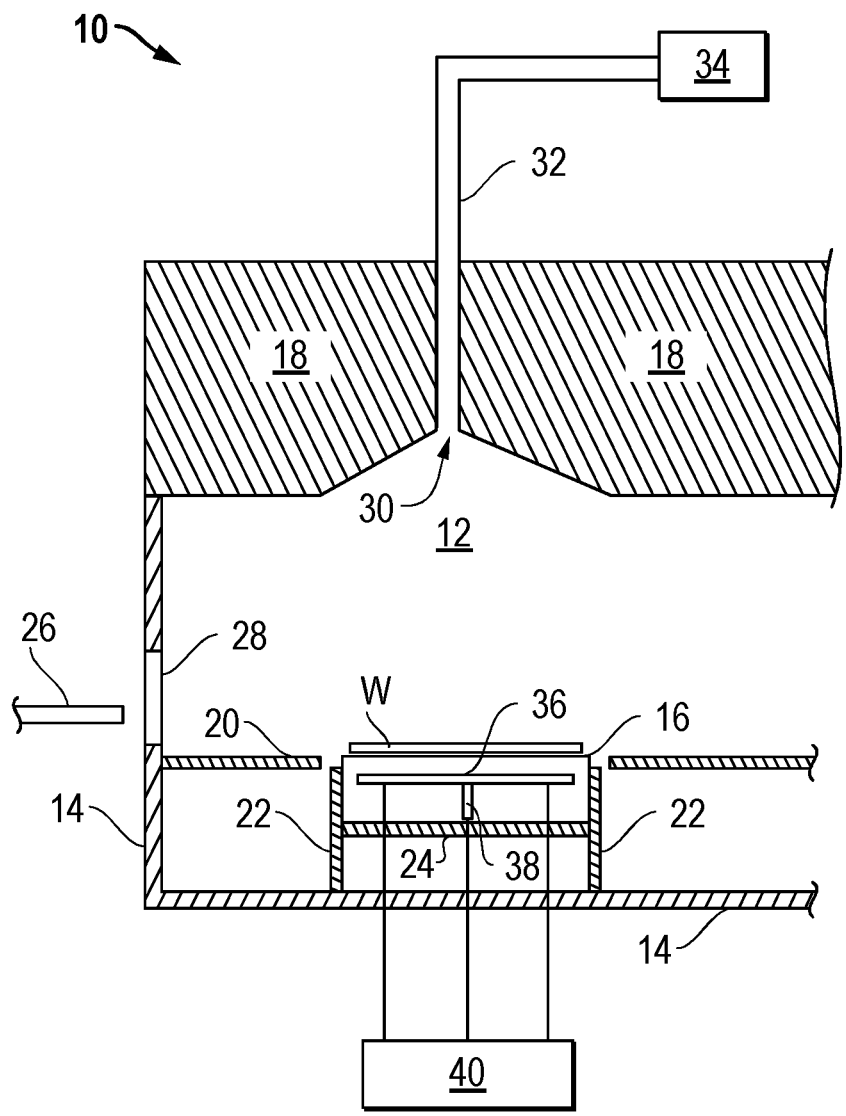
FIG. 1 (Prior Art) provides an example embodiment of a bake module that can be used to perform a bake process.

Multi-point thermocouples and methods are disclosed for ceramic heating structures. The disclosed embodiments provide relatively thin shapes for thermocouples (TCs) and multi-point connections in distinct areas to provide good temperature-sensing contacts while also providing improved flexibility. As such, cracking of ceramic bodies for heating structures is avoided. A variety of advantages and implementations can be achieved while taking advantage of the techniques described herein.

As described further below, disclosed embodiments utilize improved shapes and structures for multi-point metal TCs, such as rectangular-shaped and oval-shaped TCs. These improved TCs are connected at multiple different points to a ceramic body of a heating structure, such as a bake plate for a processing system. These multi-point TCs have predictable flex in the resulting assembly to reduce and preferably prevent stress to the ceramic material by the metal TCs brazed to the ceramic material. For example, these improved multi-point TCs can be used in an AlN multi-zone stage heater and/or other processing equipment for microelectronic workpieces. Other applications can also use the techniques described herein.

For certain embodiments, multi-point TCs are intended to have a single entry point into a measurement environment but be able to measure at several locations within that environment. As one example, a multi-zone AlN heater (e.g., operating at 800 degrees Celsius and above) can have such a single entry point and use a multi-point TC as described herein. For one solution, a multi-point TC made of a SST sheet is embedded and brazed to an AlN ceramic body. The brazing is applied to form brazed connections at the TC connection locations and measurement points of interest within the ceramic heater body. The shape for the multi-point TC can be a rectangular shape as shown in FIG. 5A, an oval shape as shown in FIG. 5B, and/or other shapes or combination of shapes. The shapes described herein are relatively thin and improve the flexural capabilities for the multi-point TC as well as allowing for better brazing connections. The shapes for the multi-point TC preferably include at least one flat surface. For certain example embodiments, the width (W) for this flat surface is between twenty (20) percent and ninety-five (95) percent of the width of the channel (WC) (e.g., $0.20*WC \leq W \leq 0.95*WC$). For certain example embodiments, the width (W) of this flat surface is at least one-and-a-half times or greater than the height (H) of the shape (e.g., $W \geq 1.5*2H$). For certain embodiments, the width (W) of the flat surface is greater than or equal to the height (H) of the shape (e.g., $W \geq H$). Other configurations can also be used. It has been found that multi-point brazing connections in combination with a rectangular shape, an oval shape, or other relatively thin shape with at least one flat surface reduces the risk and/or eliminates cracking of the ceramic plate due to expansion/contraction cycles during operation. It is also noted that brazing connections that bond metal to ceramic are usually functional within an approximate layer thickness of 10 micrometers between the opposing metal and ceramic surfaces. As used herein, a "flat" surface encompasses planar structures that have surface variations of 30% or less from a perfect plane, and these planar structures can be continuous or separated by one or more gaps. As described herein, the flat surfaces are used in part to provide connections between the multi-point TCs and the ceramic body.

Figure 2:
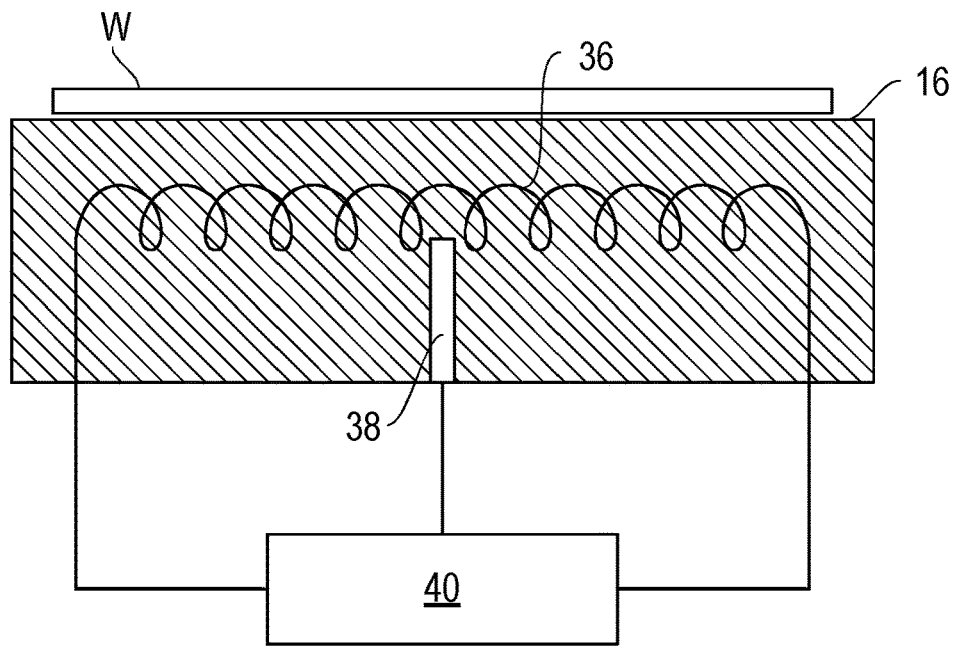
FIG. 2 (Prior Art) provides an example embodiment where a single resistive heating element is formed from a coiled metal wire and is embedded within a bake plate.
Figure 3:
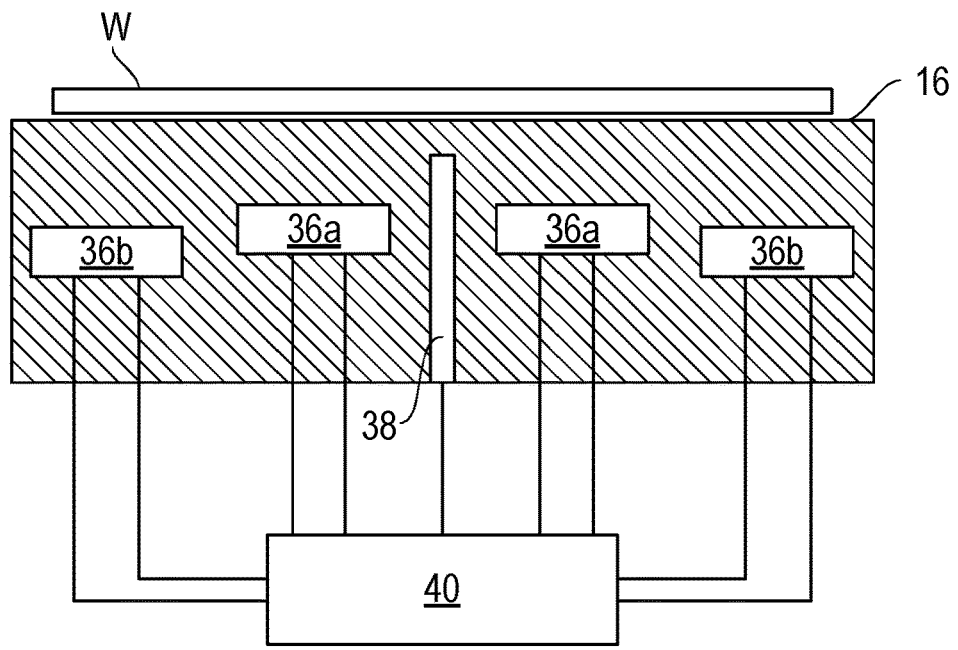
FIG. 3 (Prior Art) provides an example embodiment where multiple resistive heating elements are formed and embedded within a bake plate.
Figure 4A:
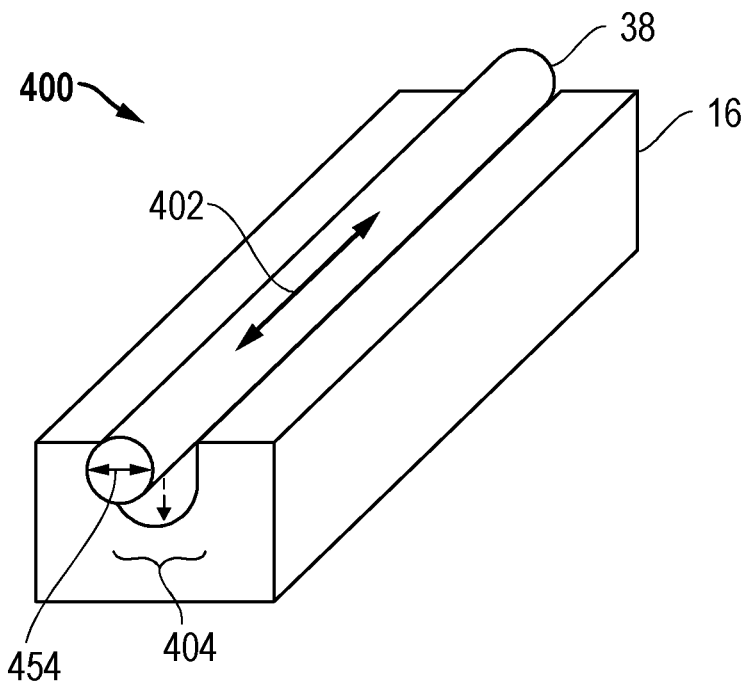
FIG. 4A (Prior Art) provides a perspective view of an example embodiment where a round, metal TC tube is used as a temperature sensor placed in a trench formed within a bake plate.
Figure 4B:
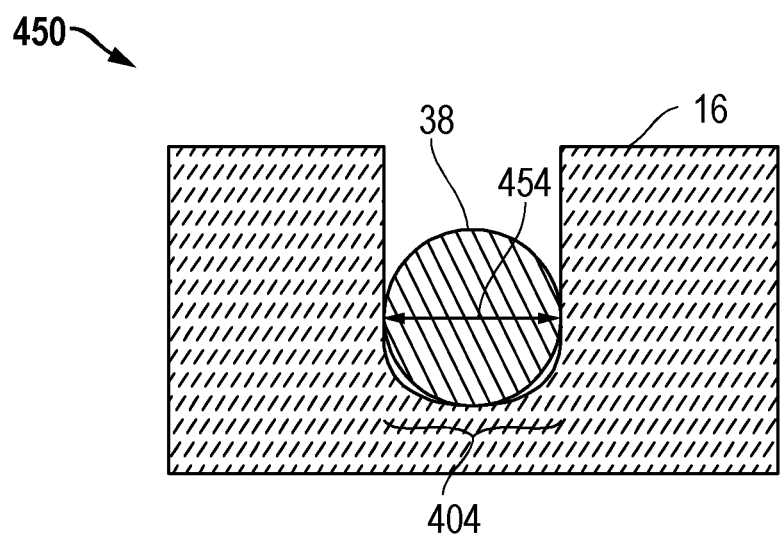
FIG. 4B (Prior Art) provides a cross-section view of the example embodiment in FIG. 4A (Prior Art).

FIG. 5A provides a perspective view 500 where a rectangular shape is used for a thermocouple 504 positioned within a channel 506 in a ceramic body 502. This rectangular-shaped thermocouple 504 can be used as the temperature sensor 38 as described above with respect to FIGS. 1-3 (Prior Art) and FIGS. 4A-4B (Prior Art). The rectangular-shaped thermocouple 504 has a flat surface 507 that is positioned adjacent a surface 509 for the ceramic body 502. For one embodiment, the ceramic body 502 can be part of the bake plate 16 described above with respect to FIGS. 1-3 (Prior Art) and FIGS. 4A-4B (Prior Art). The flat surface 507 of the thermocouple 504 is brazed or otherwise connected to the surface 509 of the ceramic body 502 as represented by connection 508. Further, connections 508 can be added at multiple distinct points along the length of the thermocouple 504 where multi-point temperature sensing is desired.

The flat surface 507 for the rectangular-shaped thermocouple 504 in part provides locations for connections 508. As described above, for certain example embodiments, the width (W) 512 for this flat surface 507 is between twenty (20) percent and ninety-five (95) percent of the width of the channel (WC) 515 (e.g., $0.20*WC \leq W \leq 0.95*WC$). For certain embodiments, the width (W) 512 for this flat surface is at least one-and-a-half times or greater than its height (H) 511 such that $W \geq 1.5*H$. For certain embodiments, the width (W) 512 of the flat surface is greater than or equal to the height (H) 511 such that $W \geq H$. Other configurations can also be used. As described further with respect to FIG. 6, which provides a cross-section view along dashed line 510, the relatively thin configuration for the thermocouple 504 provides improved flexural properties that reduce the risk of and/or prevent cracking of the ceramic body 502. The channel 506 within the ceramic body 502 preferably includes a flat surface 509 have a width greater than or equal to the width 512 of the flat surface 507 for the thermocouple 504. These flat surfaces 507/509 provide high-quality regions for brazed contacts at multiple different points along the thermocouple 504. Further, the channel 506 preferably has an overall width (WC) 515 that is two (2) percent to twenty (20) percent larger than the overall width (W) 512 of the rectangular-shaped thermocouple 504 (e.g., $1.02*W \leq WC \leq 1.2*W$), although other configurations could also be used. This width tolerance reduces and/or eliminates pressure on sidewalls due to expansion of the thermocouple 504. Variations could also be implemented while still taking advantage of the multi-point thermocouple structures and techniques described herein.

FIG. 5B provides a perspective view 550 where an oval shape is used for a thermocouple 514 positioned within a channel 506 in a ceramic body 502. As with the rectangular-shaped thermocouple 504 in FIG. 5A, the oval-shaped thermocouple 514 can be used as a temperature sensor 38 as described above with respect to FIGS. 1-3 (Prior Art) and FIGS. 4A-4B (Prior Art). The oval-shaped thermocouple 514 has a flat surface 507 that is positioned adjacent a surface 509 for the ceramic body 502. As indicated above with respect to FIG. 5A, the ceramic body 502 can be part of the bake plate 16 described above with respect to FIGS. 1-3 (Prior Art) and FIGS. 4A-4B (Prior Art). The flat surface 507 of the thermocouple 514 is brazed or otherwise connected to the surface 509 of the ceramic body 502 as represented by connection 508. Further, connections 508 can be added at multiple distinct points along the length of the thermocouple 514 where multi-point temperature measurements are desired. It is also noted that the curved edges of the oval-shaped thermocouple 514 provides improved flex as compared to straight sidewalls of the rectangular-shaped thermocouple 504 in FIG. 5A.

The flat surface 507 for the oval-shaped thermocouple 514 in part provides locations for connections 508. As described above, for certain example embodiments, the width (W) 512 for this flat surface 507 is between twenty (20) percent and ninety-five (95) percent of the width of the channel (WC) 515 (e.g., $0.20*WC \leq W \leq 0.95*WC$). For certain embodiments, the width (W) 512 for this flat surface is at least one-and-a-half times or greater than its height (H) 511 such that $W \geq 1.5*H$. For certain embodiments, the width (W) 512 of the flat surface is greater than or equal to the height (H) 511 such that $W \geq H$. Other configurations can also be used. As described further with respect to FIG. 6, which provides a cross-section view along dashed line 510, the relatively thin configuration for the thermocouple 514 provides improved flexural properties that reduce the risk of and/or prevent cracking of the ceramic body 502. The channel 506 within the ceramic body 502 preferably includes a flat surface 509 have a width greater than or equal to the width 512 of the flat surface 507 for the thermocouple 514. These flat surfaces 507/509 provide high-quality regions for brazed contacts at multiple different points along the thermocouple 514. Further, the channel 506 preferably has an overall width (WC) 515 that is between two (2) percent and fifteen (20) percent of the overall width (W) 513 of the oval-shaped thermocouple 514 (e.g., 1.02*W≤WC≤1.2*W), although other configurations could also be used. This width tolerance reduces and/or eliminates pressure on sidewalls due to expansion of the thermocouple 514. Variations could also be implemented while still taking advantage of the multi-point thermocouple structures and techniques described herein.

FIG. 6 provides a cross-section view 600 of an example embodiment along dashed line 510 for the example embodiments in FIGS. 5A and 5B. The thermocouple 504/514 is connected to the ceramic body 502 at multiple connections 508. As described herein, these connections can be made by brazing the metal thermocouple 504/514 to the ceramic body 502, although other connection techniques could also be used. The relatively thin structures used for the thermocouples 504/514 along with the multiple, distinct connections 508 allow for increased flexibility along the longitudinal direction 602. For example, the thermocouple 504/514 is allowed to flex and bow between the connection 508 as indicated by arrow 604. For one example embodiment, the metal thermocouples 504/514 are made from SST and the ceramic body 502 is made from AlN.

Figure 7:
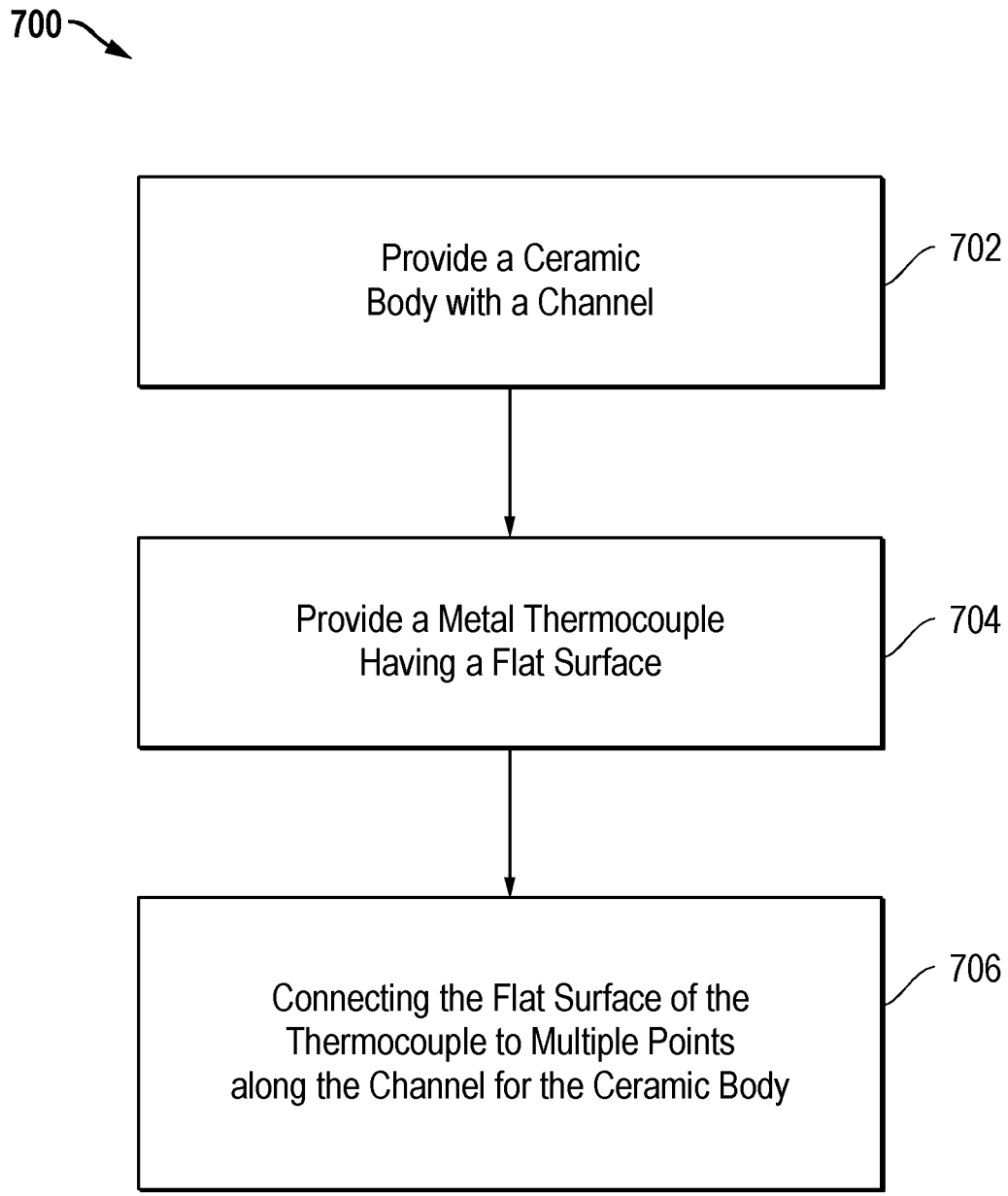
FIG. 7 is a process flow diagram of an example embodiment to form an assembly including a multi-point thermocouple and a ceramic body.

FIG. 7 is a process flow diagram 700 of an example embodiment to form an assembly including a multi-point thermocouple and a ceramic body. In block 702, a ceramic body is provided with a channel. For one embodiment, the ceramic body is AlN, and the ceramic body is used within a heater stage for the manufacture of microelectronic workpieces. In block 704, a metal thermocouple is provided having a flat surface. For one embodiment, the thermocouple is used for temperature sensing within a heater stage for the manufacture of microelectronic workpieces. In block 706, the flat surface of the thermocouple is connected to multiple points along the flat surface of the channel for the ceramic body. For one embodiment, the connections are formed by brazing the metal thermocouple to the ceramic body at multiple distinct points. It is noted that additional and/or different process steps could also be used while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. An assembly, comprising:
   a ceramic body comprising a channel;
   a thermocouple comprising metal and having a flat surface;
   wherein the flat surface of the thermocouple has connections to the ceramic body at multiple points along the channel for the ceramic body; and
   one or more heating elements positioned inside of the ceramic body.

2. The assembly of claim 1, wherein a width of the flat surface is between twenty (20) percent and ninety-five (95) percent of a width of the channel.

3. The assembly of claim 1, wherein a width of the flat surface is at least one-and-a-half times or greater than a height of the thermocouple and an overall width of the channel is two (2) percent to twenty (20) percent larger than an overall width of the thermocouple.

4. The assembly of claim 1, wherein the flat surface comprises a continuous flat surface or a flat surface separated by one or more gaps.

5. The assembly of claim 1, wherein the connections between the thermocouple and the ceramic body comprise brazed connections.

6. The assembly of claim 1, wherein the thermocouple is a rectangular-shaped thermocouple or an oval-shaped thermocouple.

7. The assembly of claim 1, wherein the thermocouple comprises stainless steel, and wherein the ceramic body comprises aluminum nitride.

8. The assembly of claim 1, wherein the channel for the ceramic body has a flat surface with a width greater than or equal to a width of the flat surface for the thermocouple, and wherein an overall width of the channel for the ceramic body is between two percent and twenty percent of an overall width of the thermocouple.

9. The assembly of claim 1, wherein the assembly comprises a bake plate in a post exposure bake module.

10. The assembly of claim 1, wherein the thermocouple is a multi-point thermocouple which senses temperature at multiple distinct points along a length of the multi-point thermocouple, and at least some of the connections are provided at locations sensed by the multi-point thermocouple, and
wherein the multi-point thermocouple flexes at locations between the connections in a direction transverse to a length direction of the multi-point thermocouple.

11. A processing system, comprising:
a processing chamber;
a bake plate positioned within the processing chamber, the bake plate comprising:
a ceramic body comprising a channel; and
a thermocouple comprising metal and having a flat surface;
wherein the flat surface of the thermocouple has connections to the ceramic body at multiple points along the channel for the ceramic body; and
one or more heating elements positioned inside of the ceramic body.

12. The processing system of claim 11, wherein the connections between the thermocouple and the ceramic body comprise brazed connections.

13. The processing system of claim 11, wherein the thermocouple is a rectangular-shaped thermocouple or an oval-shaped thermocouple.

14. The processing system of claim 11, wherein the thermocouple is a multi-point thermocouple which senses temperature at multiple locations along a length of the multi-point thermocouple, and the connections are provided at locations at which temperature is sensed by the multi-point thermocouple.

15. A method to form an assembly, comprising:
providing a ceramic body comprising a channel and one or more heaters positioned in the ceramic body;
providing a thermocouple comprising metal and having a flat surface; and
connecting the flat surface of the thermocouple to the ceramic body at multiple points along the channel for the ceramic body.

16. The method of claim 15, wherein the flat surface comprises a continuous flat surface or a flat surface separated by one or more gaps.

17. The method of claim 15, wherein the thermocouple is a rectangular-shaped thermocouple or an oval-shaped thermocouple.

18. The method of claim 15, wherein the assembly is part of a post exposure bake module.

19. The method of claim 15, wherein the thermocouple is a multi-point thermocouple which senses temperature at multiple distinct points along a length of the multi-point thermocouple, and wherein the connecting comprises connecting the multi-point thermocouple to the ceramic body at locations temperature is sensed by the multi-point thermocouple.

20. An assembly comprising:
a ceramic body comprising a channel, the channel having a flat surface;
a multi-point thermocouple which senses temperature at multiple distinct points along a length of the multi-point thermocouple, the multi-point thermocouple having a flat surface facing the flat surface of the ceramic body; and
a plurality of connections between the flat surface of the ceramic body and the flat surface of the multi-point thermocouple, at least some of the connections provided at locations temperature is sensed by the multi-point thermocouple.

21. The assembly of claim 20, further including one or more heaters positioned inside the ceramic body.

22. The assembly of claim 21, wherein a width of the flat surface of the multi-point thermocouple is at least one-and-a-half times a height of the multi-point thermocouple, and an overall width of the channel is two (2) percent to twenty (20) percent larger than an overall width of the multi-point thermocouple.

23. The assembly of claim 22, wherein at locations between the connections, the multi-point thermocouple flexes in a direction transverse to a length direction of the multi-point thermocouple.

\* \* \* \* \*